United States Patent
Wu et al.

(10) Patent No.: US 10,312,118 B2
(45) Date of Patent: Jun. 4, 2019

(54) BONDING APPARATUS AND METHOD

(71) Applicant: TAIWAN SEMICONDUCTOR MANUFACTURING CO., LTD., Hsinchu (TW)

(72) Inventors: Pei-Shan Wu, Yunlin County (TW); Yi-Ting Hu, Chiayi County (TW); Ming-Tan Lee, Kaohsiung (TW); Yu-Lin Wang, Hsinchu County (TW); Yuh-Sen Chang, Hsinchu County (TW); Pin-Yi Shin, Hsinchu County (TW); Wen-Ming Chen, Miaoli County (TW); Wei-Chih Chen, Hsinchu County (TW); Chih-Yuan Chiu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 19 days.

(21) Appl. No.: 14/157,271

(22) Filed: Jan. 16, 2014

(65) Prior Publication Data

US 2015/0200118 A1 Jul. 16, 2015

(51) Int. Cl.
*H01L 21/67* (2006.01)
*H01L 21/683* (2006.01)
*H01L 21/50* (2006.01)

(52) U.S. Cl.
CPC ........ *H01L 21/67144* (2013.01); *H01L 21/50* (2013.01); *H01L 21/6838* (2013.01); *H01L 2224/16225* (2013.01); *H01L 2224/81* (2013.01); *Y10T 29/53178* (2015.01)

(58) Field of Classification Search
CPC ................ H01L 21/6838; H01L 21/50; H01L 21/67144; H05K 13/0408; H05K 13/0452; H05K 13/08; H05K 13/041; H05K 13/0411; Y10T 156/1089; Y10T 156/1092; Y10T 29/53178
USPC ........... 156/297, 299; 29/832, 834, 743, 740
See application file for complete search history.

(56) References Cited

U.S. PATENT DOCUMENTS

| 4,832,247 | A | * | 5/1989 | Ciniglio | B23K 3/0676 118/423 |
| 5,002,448 | A | * | 3/1991 | Kamijima | B23P 19/04 29/739 |
| 5,839,187 | A | * | 11/1998 | Sato | H01L 21/67144 29/743 |
| 5,862,586 | A | * | 1/1999 | Kimura | H05K 13/04 29/564 |

(Continued)

FOREIGN PATENT DOCUMENTS

JP 2000124671 A * 4/2000

*Primary Examiner* — John L Goff, II
(74) *Attorney, Agent, or Firm* — McDermott Will & Emery LLP

(57) ABSTRACT

A bonding apparatus includes a wafer stage, a first chip stage, a first chip transporting device, a second stage and a second chip transporting device. The wafer stage is used for holding a wafer. The first chip stage is used for holding at least one first chip. The first chip transporting device is used for transporting the first chip from the first chip stage onto the wafer. The second chip stage is used for holding at least one second chip. The second chip transporting device is used for transporting the second chip from the second chip stage onto the wafer.

17 Claims, 7 Drawing Sheets

(56) References Cited

U.S. PATENT DOCUMENTS

| | | | | |
|---|---|---|---|---|
| 2002/0030736 A1* | 3/2002 | Hudson | ............ | H05K 13/0408 |
| | | | | 348/86 |
| 2002/0133940 A1* | 9/2002 | Kadomatsu | ........ | H05K 13/0452 |
| | | | | 29/832 |
| 2004/0003891 A1* | 1/2004 | Cheng | ................. | B23K 3/0623 |
| | | | | 156/297 |
| 2007/0018295 A1* | 1/2007 | Kim | ........................ | H01L 24/83 |
| | | | | 257/678 |
| 2008/0005894 A1* | 1/2008 | Okuda | .............. | H05K 13/0452 |
| | | | | 29/740 |

* cited by examiner

BONDING APPARATUS AND METHOD

BACKGROUND

In semiconductor technologies, chips can be bonded to a semiconductor wafer, referred to as chip-to-wafer (or chip-on wafer) bonding, to achieve three dimensional packing with high packing density, short wiring, and improved reliability and quality. The chip-to-wafer bonding technology has various applications such as imaging sensors, memory devices, and micro-electro-mechanical systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
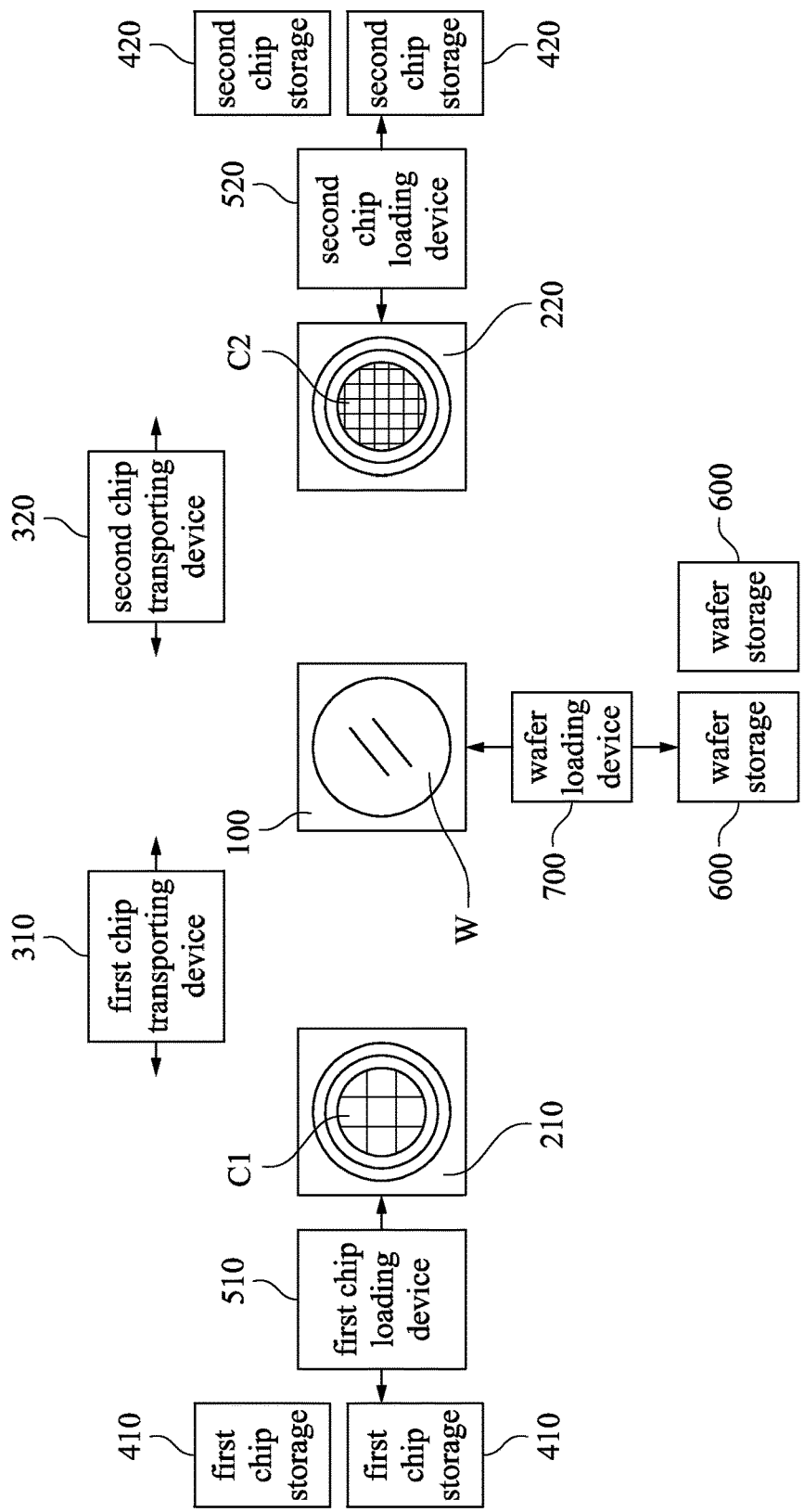
FIG. 1 is a block diagram of a bonding apparatus in accordance with various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In the formation of three-dimensional integrated circuits, different chips may be bonded on or to an interposer wafer by a bonding machine. FIG. 1 is a block diagram of a bonding apparatus in accordance with various embodiments of the present disclosure. As shown in FIG. 1, the bonding apparatus includes a wafer stage 100, a first chip stage 210, a first chip transporting device 310, a second chip stage 220, and a second chip transporting device 320. The wafer stage 100 is used for holding a wafer W to be bonded with multiple chips. The first chip stage 210 is used for holding at least one first chip C1 to be bonded to the wafer W. The second chip stage 220 is used for holding at least one second chip C2 to be bonded to the wafer W as well. The first transporting device 310 is used for transporting the first chip C1 from the first chip stage 210 onto the wafer W, so as to bond the first chip C1 to the wafer W. The second transporting device 320 is used for transporting the second chip C2 from the second chip stage 220 onto the wafer W, so as to bond the second chip C2 to the wafer W.

In such a configuration, the bonding apparatus allows at least two different chips, including the first chip C1 and the second chip C2, to be bonded to the wafer W held by the wafer stage 100 during the same period of time, so that the working efficiency of the bonding apparatus, such as wafer per hour (WPH), can be improved.

In various embodiments, the bonding apparatus may additionally include a plurality of chip stages (not shown) in addition to the first chip stage 210 and the second chip stage 220 for holding chips. Similarly, the bonding apparatus may additionally include a plurality of chip transporting devices (not shown) in addition to the first chip transporting device 310 and the second chip transporting device 320 for transporting the chips from the chip stages onto the wafer W held by the wafer stage 100. Hence, more than two different chips can be bonded to the wafer W during the same period of time. In various embodiments, the number of the chip stages and the number of the chip transporting devices may depend on the number of sorts of the chips are to be bonded to the wafer W.

In various embodiments, as shown in FIG. 1, rated load weight of the first chip transporting device 310 is unequal to rated load weight of the second chip transporting device 320. As such, the first chip transporting device 310 and the second chip transporting device 320 can respectively transport the first chip C1 and the second chip C2 that have different weights or different sizes. In other words, the first chip C1 may be larger than the second chip C2, and vice versa. As such, chips having different weights or different sizes can be bonded to the wafer W during the same period of time. "Rated load weight" in this context may refer to the heaviest load weight that a piece of equipment is designed to deal with.

In various embodiments, as shown in FIG. 1, the bonding apparatus further includes a plurality of first chip storages 410 and a first chip loading device 510. Each of the first chip storages 410 contains the first chips C1 therein. For example, at least one of the first chip storages 410 may hold the first chips C1 diced from a wafer. The first chip loading device 510 is used for transferring the first chips C1 from the first chip storages 410 to the first chip stage 210 in an alternating manner. For example, the first chip loading device 510 may take away the first chips C1 from one of the first chip storages 410. When this first chip storage 410 is running out of the first chips C1, the first chip loading device 510 may move to another of the first chip storages 410 and take away the first chips C1 contained therein. In such a configuration, the first chip loading device 510 can keep providing the first chips C1 to the first chip stage 210 even though one of the first chip storages 410 is running out of the first chips C1, so that the working efficiency of the bonding apparatus, such as WPH, can be improved. In various embodiments, at least one of the first chip storages 410 may be, but is not limited to be, the cassette for holding diced wafers.

In various embodiments, as shown in FIG. 1, the bonding apparatus further includes a plurality of second chip storages 420 and a second chip loading device 520. Each of the second chip storages 420 contains the second chips C2 therein. For example, at least one of the second chip storages 420 may hold the second chips C2 diced from a wafer. The second chip loading device 520 is used for transferring the second chips C2 from the second chip storages 420 to the second chip stage 220 in an alternating manner. For example, the second chip loading device 520 may take away the second chips C2 from one of the second chip storages 420. When this second chip storage 420 is running out of the second chips C2, the second chip loading device 520 may move to another of the second chip storages 420 and take away the second chips C2 contained therein. In such a configuration, the second chip loading device 520 can keep providing the second chips C2 to the second chip stage 220 even though one of the second chip storages 420 is running out of the second chips C2, so that the working efficiency of the bonding apparatus, such as WPH, can be improved. In various embodiments, at least one of the second chip storages 420 may be, but is not limited to be, the cassette for holding diced wafers.

In various embodiments, as shown in FIG. 1, the bonding apparatus further includes a plurality of wafer storages 600 and a wafer loading device 700. Each of the wafer storages 600 contains the wafers W to be bonded therein. For example, at least one of the wafer storages 600 may be a cassette for holding a plurality of wafers W, such as a front opening unified pod (FOUP). The wafer loading device 700 is used for transferring the wafers W from the wafer storages 600 to the wafer stage 100 in an alternating manner. For example, the wafer loading device 700 may take away the wafers W from one of the wafer storages 600. When this wafer storage 600 is running out of the wafers W, the wafer loading device 700 may move to another of the wafer storages 600 and take away the wafers W contained therein. In such a configuration, the wafer loading device 700 can keep providing the wafer W to the wafer stage 100 even though one of the wafer storages 600 is running out of the wafers W, so that the working efficiency of the bonding apparatus, such as WPH, can be improved.

Figure 2:
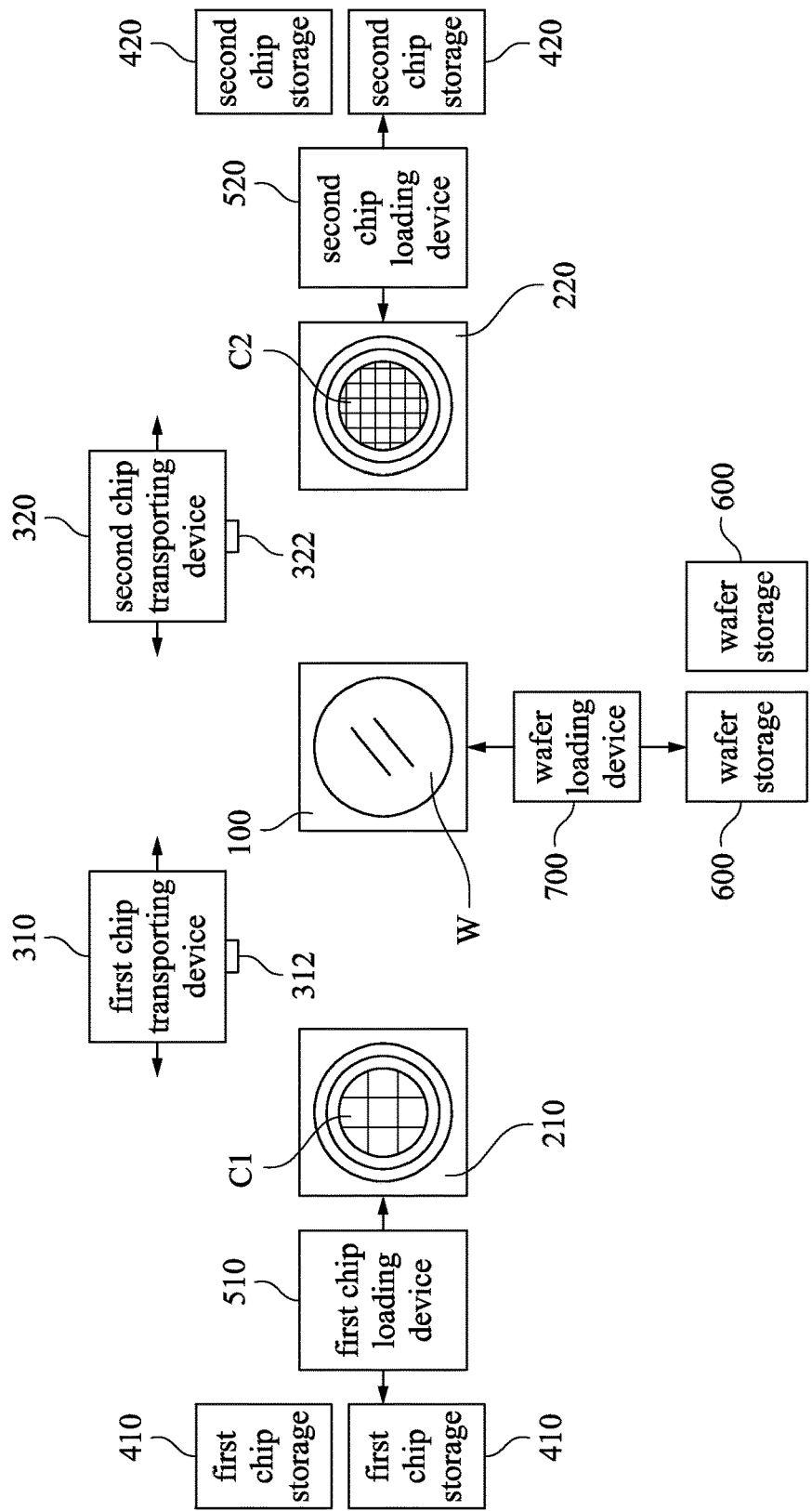
FIG. 2 is a block diagram of the bonding apparatus in accordance with various embodiments of the present disclosure.

FIG. 2 is a block diagram of the bonding apparatus in accordance with various embodiments of the present disclosure. As shown in FIG. 2, the main difference between the embodiments and which are shown in FIG. 1 is that: the first chip transporting device 310 may include a first suction device 312, and the second chip transporting device 320 may include a second suction device 322. The first suction device 312 is used for applying a first suction force to the first chip C1, so as to facilitate the first chip transporting device 310 to carry and move the first chip C1. Similarly, the second suction device 322 is used for applying a second suction force to the second chip C2, so as to facilitate the second chip transporting device 320 to carry and move the second chip C2. For example, the first chip C1 may be adhered to an adhesive tape after the dicing process, and the first suction device 312 may pick up the first chip C1 to make it separated or peeled from the adhesive tape, so that the first chip transporting device 310 can carry and move the first chip C1. Similarly, the second chip C2 may be adhered to an adhesive tape after the dicing process as well, and the second suction device 322 may pick up the second chip C2 to make it separated or peeled from the adhesive tape, so that the second chip transporting device 320 can carry and move the second chip C2. In various embodiments, the first suction device 312 and the second suction device 322 may be, but are not limited to be, the vacuum suction nozzles that apply vacuum forces to the chips.

In various embodiments, the first suction force is unequal to the second suction force, so as to facilitate the first suction device 312 and the second suction device 322 to respectively hold the first chip C1 and the second chip C2 in different weights or different sizes. For example, the first suction force may be greater than the second suction force when the first chip C1 is larger than the second chip C2, and vice versa.

Figure 3:
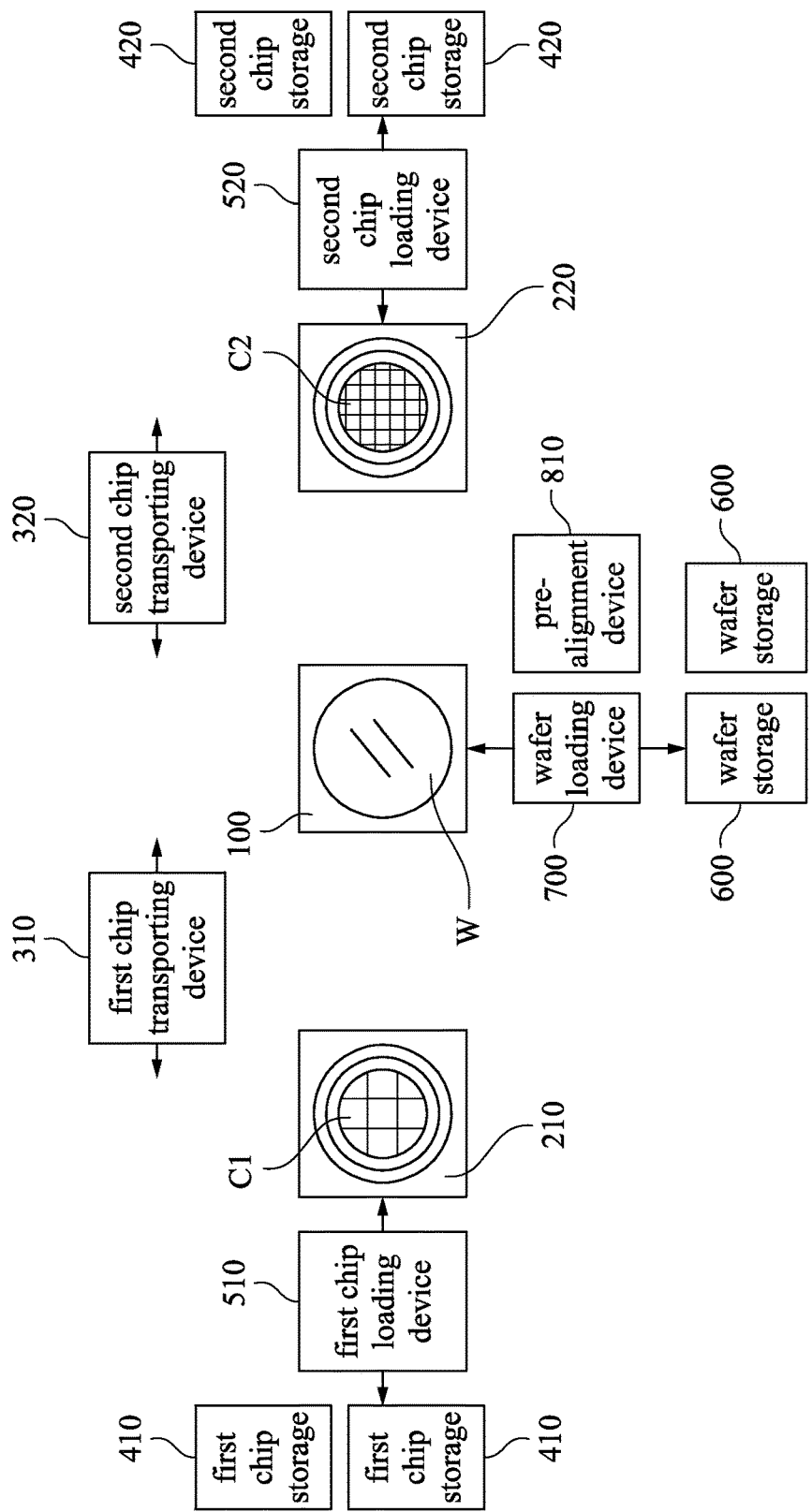
FIG. 3 is a block diagram of the bonding apparatus in accordance with various embodiments of the present disclosure.

FIG. 3 is a block diagram of the bonding apparatus in accordance with various embodiments of the present disclosure. As shown in FIG. 3, the main difference between the embodiments and which are shown in FIG. 1 is that the bonding apparatus further includes a pre-alignment device 810. The pre-alignment device 810 is used for adjusting an orientation of the wafer W. For example, the pre-alignment device 810 can be used in some implementations to orient the wafer W in a predetermined orientation when the wafer is transferred to the wafer stage 100, so that the wafer W may be accurately placed on wafer stage 100 in the predetermined orientation. For example, the pre-alignment device 810 may locate at least one reference mark on the wafer W (e.g., locating a flat or notch on the wafer W), so as to confirm the orientation of the wafer W. Through the pre-alignment device 810, the wafer W can be placed on the wafer stage 100 in the predetermined orientation, so as to facilitate to bond the first chip C1 and the second chip C2 to the predetermined position on the wafer W.

In FIG. 3, although the suction devices (including the first suction device 312 and the second suction device 322 in FIG. 2) are not shown, they can be employed associated with the chip transporting devices in the embodiments shown in FIG. 3 as well.

Figure 4:
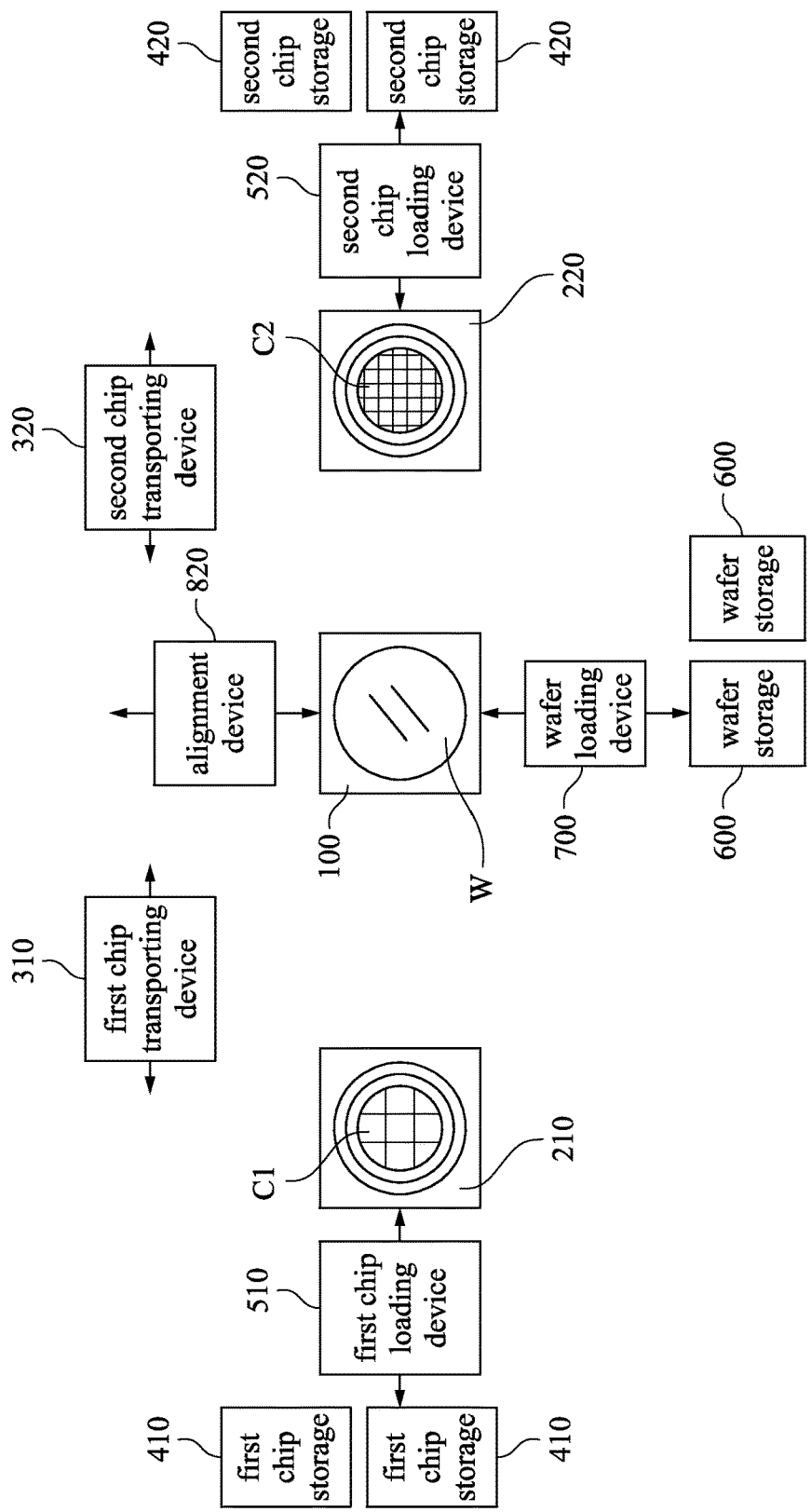
FIG. 4 is a block diagram of the bonding apparatus in accordance with various embodiments of the present disclosure.

FIG. 4 is a block diagram of the bonding apparatus in accordance with various embodiments of the present disclosure. As shown in FIG. 4, the main difference between the embodiments and which are shown in FIG. 1 is that the bonding apparatus further includes an alignment device 820. The alignment device 820 is used for aligning the first chip C1, the second chip C2 or any combination thereof with a predetermined position on the wafer W. For example, when the first chip transporting device 310 moves the first chip C1 to a position above the wafer W, the alignment device 820 can move to a position between the first chip C1 and the wafer W, so as to perform the alignment process. Similarly, when the second chip transporting device 320 moves the second chip C2 to a position above the wafer W, the alignment device 820 can move to a position between the second chip C2 and the wafer W, so as to perform the alignment process. The alignment process mentioned above may include the course alignment, the fine alignment or any combination thereof in various embodiments.

In various embodiments, the alignment device 820 may align the first chip C1 and the second chip C2 with the wafer W in an alternating manner. For example, the alignment device 820 may align the first chip C1 with the wafer W prior to aligning the second chip C2 with the wafer W, and vice versa.

In FIG. 4, although the suction devices (See FIG. 2) and the pre-alignment device 810 (See FIG. 3) are not shown, any combination of them can be employed associated with the bonding apparatus in the embodiments shown in FIG. 4.

Figure 5:
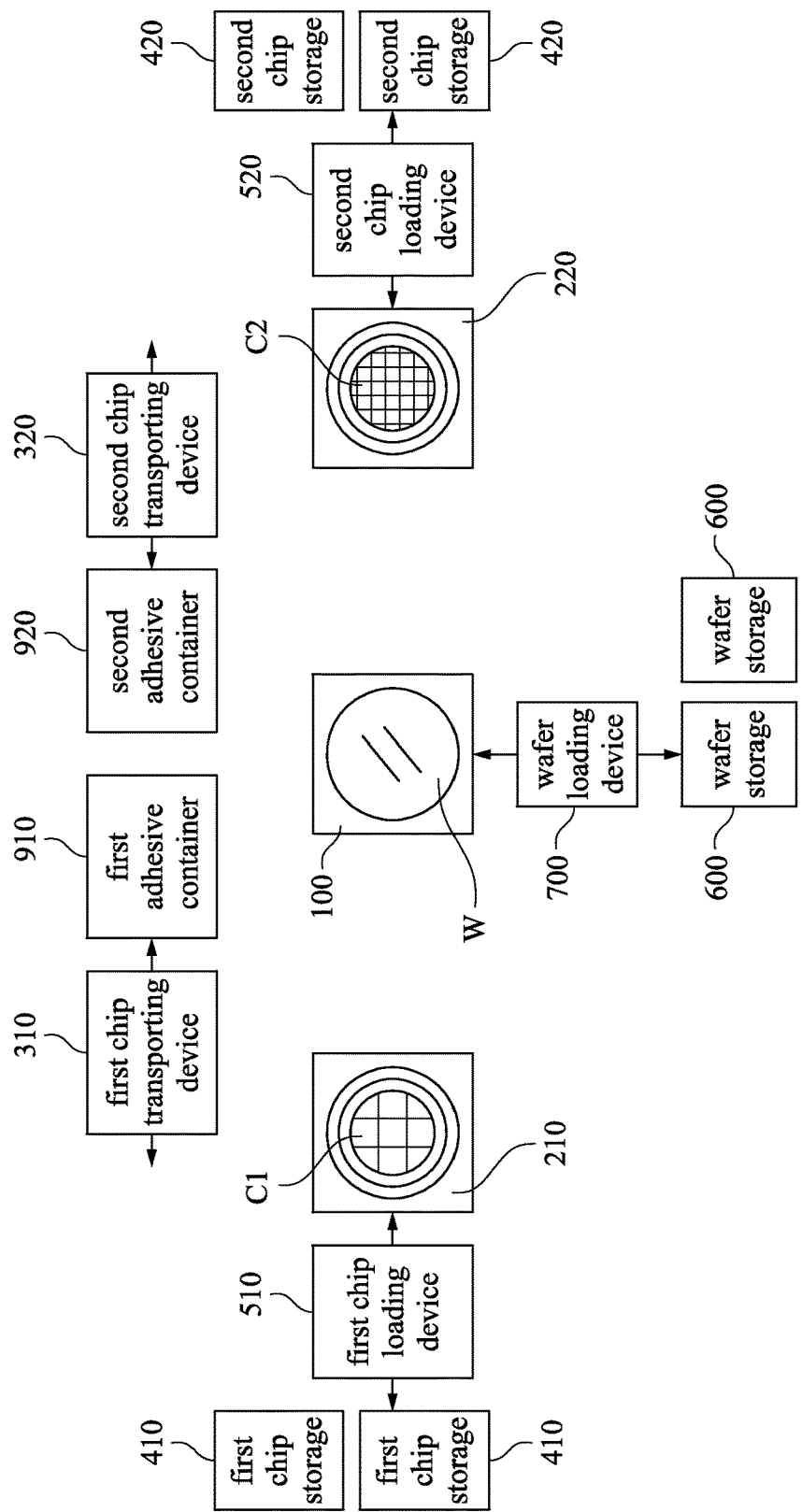
FIG. 5 is a block diagram of the bonding apparatus in accordance with various embodiments of the present disclosure.

FIG. 5 is a block diagram of the bonding apparatus in accordance with various embodiments of the present disclosure. As shown in FIG. 5, the main difference between the embodiments and which are shown in FIG. 1 is that the bonding apparatus further includes a first adhesive container 910 and a second adhesive container 920. The first adhesive container 910 and the second adhesive container 920 contain adhesive material therein. The moving path of the first chip transporting device 310 is across the first adhesive container 910, so that the first chip transporting device 310 can lower the first chip C1 into the first adhesive container 910 to make the adhesive material to apply to the first chip C1. When the first chip transporting device 310 bonds the first chip C1 to the wafer W, the adhesive material may fill spaces among the wafer W and the first chip C1 such as gaps around bonded contacts, so as to securely adhere the first chip C1 to the wafer W. Similarly, the moving path of the second chip transporting device 320 is across the second adhesive container 920, so that the second chip transporting device 320 can lower the second chip C2 into the second adhesive container 920 to make the adhesive material to apply to the second chip C2. When the second chip transporting device 320 bonds the second chip C2 to the wafer W, the adhesive material may fill spaces among the wafer W and the second chip C2 such as gaps around bonded contacts, so as to securely adhere the second chip C2 to the wafer W.

In FIG. 5, although the suction devices (See FIG. 2), the pre-alignment device 810 (See FIG. 3) and the alignment device 820 (See FIG. 4) are not shown, any combination of them can be employed associated with the bonding apparatus in the embodiments shown in FIG. 5.

Figure 6:
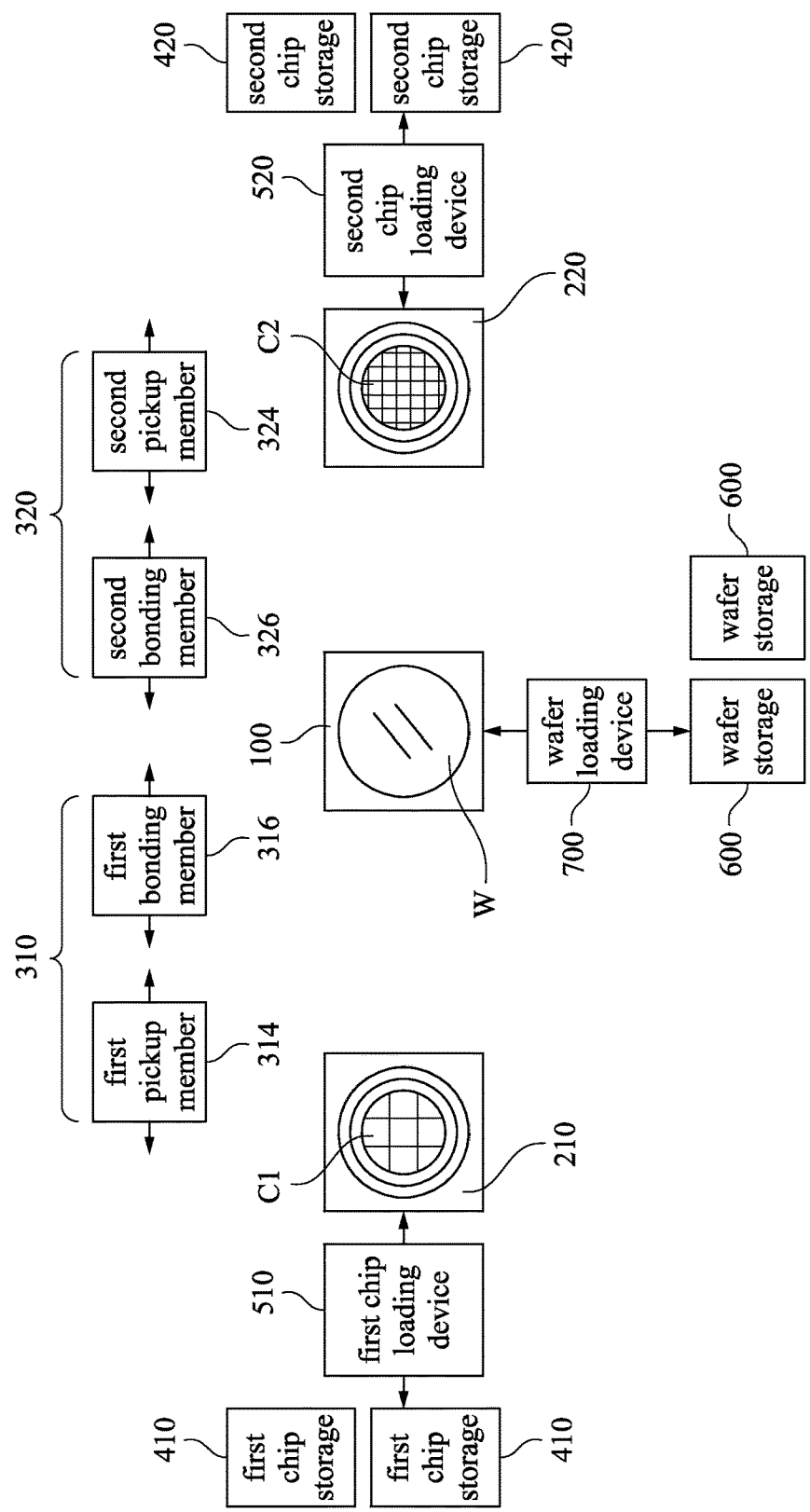
FIG. 6 is a block diagram of the bonding apparatus in accordance with various embodiments of the present disclosure.

FIG. 6 is a block diagram of the bonding apparatus in accordance with various embodiments of the present disclosure. As shown in FIG. 6, the main difference between the embodiments and which are shown in FIG. 1 is that: the first chip transporting device 310 includes a first pickup member 314 and a first bonding member 316. The first pickup member 314 is used for picking up the first chip C1 from the first chip stage 210. The first bonding member 316 is used for bonding the picked up first chip C1 to the wafer W. The first pickup member 314 and the first bonding member 316 are spatially separated. For example, the first pickup member 314 and the first bonding member 316 are two separated robot arms that work individually. The first pickup member 314 and the first bonding member 316 may respectively have suction devices for holding the first chip C1. During the process of transporting the first chip C1 onto the wafer W, the first pickup member 314 can pick up the first chip C1 from the first chip stage 210 by the suction force, and then, the first pickup member 314 can transfer the first chip C1 to the first bonding member 316. Then, the first bonding member 316 can hold the first chip C1 by the suction force and move it to a predetermined position above the wafer W. Then, the first bonding member 316 can lower and bond the first chip C1 to the wafer W. When the first bonding member 316 is performing the bonding process, the first pickup member 314 can move back to the first chip stage 210 to pick up the next first chip C1 because the first pickup member 314 and the first bonding member 316 are separated from each other and capable of working individually. As such, the working efficiency of the bonding apparatus, such as WPH, can be improved.

Similarly, the second chip transporting device 320 includes a second pickup member 324 and a second bonding member 326. The second pickup member 324 is used for picking up the second chip C2 from the second chip stage 220. The second bonding member 326 is used for bonding the second chip C2 to the wafer W. The second pickup member 324 and the second bonding member 326 are spatially separated. For example, the second pickup member 324 and the second bonding member 326 are two separated robot arms that work individually. The second pickup member 324 and the second bonding member 326 may respectively have suction devices for holding the second chip C2. During the process of transporting the second chip C2 to the wafer W, the second pickup member 324 can pick up the second chip C2 from the second chip stage 220 by the suction force, and then, the second pickup member 324 can transfer the second chip C2 to the second bonding member 326. Then, the second bonding member 326 can hold the second chip C2 by the suction force and move it to a predetermined position above the wafer W. Then, the second bonding member 326 can lower and bond the second chip C2 to the wafer W. When the second bonding member 326 is performing the bonding process, the second pickup member 324 can move back to the second chip stage 220 to pick up the next second chip C2 because the second pickup member 324 and the second bonding member 326 are separated from each other and capable of working individually. As such, the working efficiency of the bonding apparatus, such as WPH, can be improved.

In FIG. 6, although the suction devices (See FIG. 2), the pre-alignment device 810 (See FIG. 3), the alignment device 820 (See FIG. 4) and the adhesive containers (See FIG. 5) are not shown, any combination of them can be employed associated with the bonding apparatus in the embodiments shown in FIG. 6.

Figure 7A:
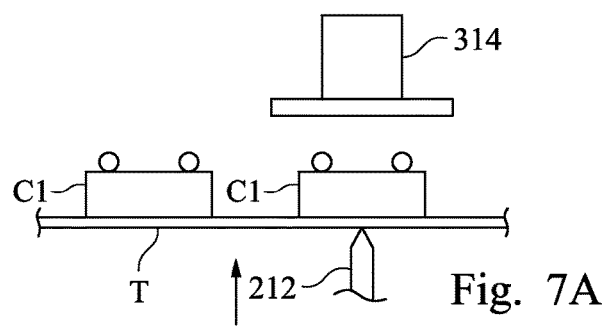
FIGS. 7A to 7H are side views of the process for transporting the first chip onto the wafer in accordance with various embodiments.

FIGS. 7A to 7H are side views of the process for transporting the first chip C1 onto the wafer W in accordance with various embodiments. As shown in FIG. 7A, the first chips C1 are adhered to an adhesive tape T after dicing process. A pushup member 212 positioned below the adhesive tape T can push one of the first chips C1 upwardly.

Figure 7E:
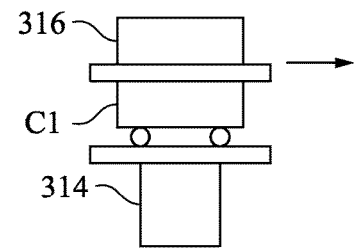
Figure 7B:
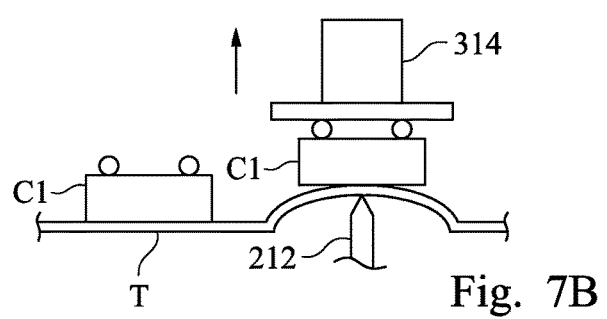

As shown in FIG. 7B, the first pickup member 314 can apply the suction force to the first chip C1 that is pushed by the pushup member 212. Then, the first pickup member 314 can move upwardly, so as to make the first chip C1 separated or peeled from the adhesive tape T, as shown in FIG. 7C. Then, the first pickup member 314 rotates to be in the orientation as shown in FIG. 7D.

As shown in FIG. 7E, the rotated first pickup member 314 can move to a position below the first bonding member 316 and stop applying the suction force to the first chip C1. The first bonding member 316 can apply the suction force to the first chip C1 and move it away from the first pickup member 314.

Figure 7F:
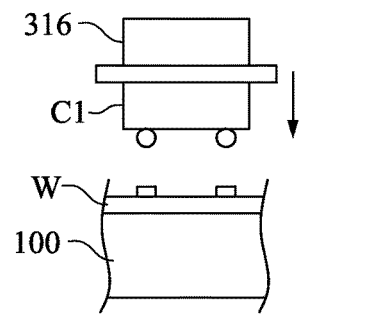
Figure 7C:
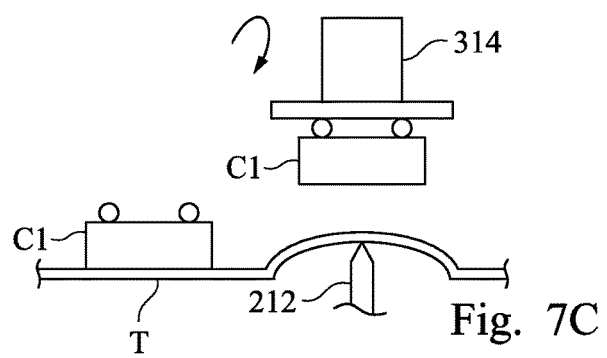
Figure 7G:
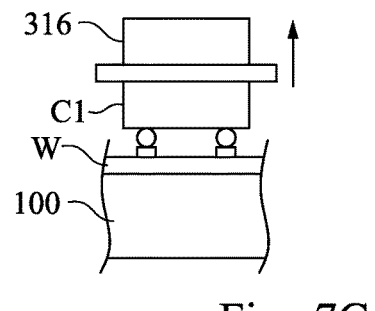
Figure 7D:
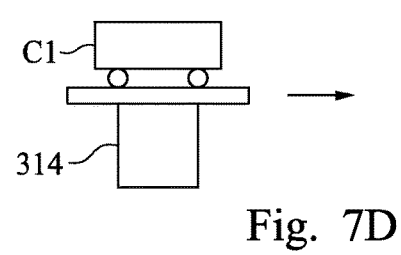
Figure 7H:
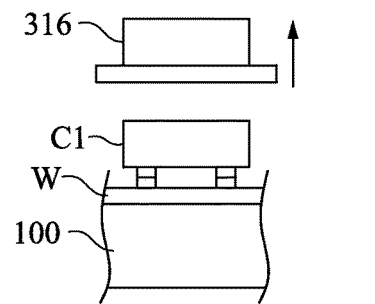

As shown in FIG. 7F, the first bonding member 316 can move to a predetermined position above the wafer W on the wafer stage 100. Then, the first bonding member 316 can lower the first chip C1 and bond it to the wafer W, as shown in FIG. 7G. Then, the first bonding member 316 can stop applying the suction force to the first chip C1, and can move upwardly to leave the first chip C1 on the wafer W, as shown in FIG. 7H. Through the process, the first chip C1 can be transported and bonded to the wafer W. The process for transporting the second chip C2 to the wafer W is similar to the process shown in FIGS. 7A to 7H in various embodiments, and therefore, it is not described repeatedly.

In various embodiments, a bonding apparatus is disclosed that includes a wafer stage, a first chip stage, a first transporting device, a second stage and a second transporting device. The wafer stage is used for holding a wafer. The first chip stage is used for holding at least one first chip. The first transporting device is used for transporting the first chip from the first chip stage onto the wafer. The second chip stage is used for holding at least one second chip. The second transporting device is used for transporting the second chip from the second chip stage onto the wafer.

Also disclosed is a bonding apparatus that includes a wafer stage, a plurality of chip stages and a plurality of chip transporting devices. The wafer stage is used for holding a wafer. The chip stages are used for respectively holding a plurality chips. The chip transporting devices are used for respectively transporting the chips from the chip stages onto the wafer.

Also disclosed is a method for bonding at least one first chip and at least one second chip to a wafer. The method includes the steps below. The wafer is provided on the wafer stage. The first chip and the second chip are respectively provided on the first chip stage and the second chip stage. The first chip and the second chip are respectively transported from the first chip stage and the second chip stage onto the wafer.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the disclosure or of any exemplified term. Likewise, the disclosure is not limited to various embodiments given in this specification.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Reference throughout the specification to "various embodiments" means that a particular feature, structure, implementation, or characteristic described in connection with the embodiments is included in at least one embodiment of the present disclosure. Thus, uses of the phrases "in various embodiments" in various places throughout the specification are not necessarily all referring to the same embodiment. Furthermore, the particular features, structures, implementation, or characteristics may be combined in any suitable manner in one or more embodiments.

Furthermore, relative terms, such as "lower" or "bottom" and "upper" or "top", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A bonding apparatus, comprising:
a wafer stage for holding a wafer;
a first chip stage for holding at least one first chip;
a first chip transporting device movable from the first chip stage to the wafer stage for transporting the first chip from the first chip stage,
wherein the first chip transporting device comprises:
a first pickup member for picking up the first chip from the first chip stage; and
a first bonding member for bonding the first chip to the wafer, wherein the first pickup member and the first bonding member are spatially separated;
a second chip stage for holding at least one second chip;
a second chip transporting device movable from the second chip stage to the wafer stage for transporting the second chip from the second chip stage, wherein the first and second chip transporting devices are configured to transport the first and second chips onto the same wafer, wherein heaviest weights that the first and second chip transporting devices are designed to deal with are unequal; and an alignment device movable to a position between the first chip and the wafer when the first chip transporting device moves the first chip to a position above the wafer.

2. The bonding apparatus of claim 1, wherein the first chip transporting device comprises a first suction device for applying a first suction force to the first chip; and wherein the second chip transporting device comprises a second suction device for applying a second suction force to the second chip, wherein the first suction force is unequal to the second suction force.

3. The bonding apparatus of claim 1, further comprising:
a plurality of first chip storages; and
a first chip loading device for transferring a plurality of the first chips from the first chip storages to the first chip stage in an alternating manner.

4. The bonding apparatus of claim 3, further comprising:
a plurality of second chip storages; and
a second chip loading device for transferring a plurality of the second chips from the second chip storages to the second chip stage in an alternating manner.

5. The bonding apparatus of claim 1, further comprising:
a plurality of wafer storages; and
a wafer loading device for transferring a plurality of the wafers from the wafer storages to the wafer stage in an alternating manner.

6. The bonding apparatus of claim 1, further comprising:
a pre-alignment device for adjusting an orientation of the wafer.

7. The bonding apparatus of claim 1, further comprising:
a first adhesive container, wherein a moving path of the first chip transporting device is across the first adhesive container; and
a second adhesive container, wherein a moving path of the second chip transporting device is across the second adhesive container.

8. The bonding apparatus of claim 1, wherein the second chip transporting device comprises:
a second pickup member for picking up the second chip from the second chip stage; and
a second bonding member for bonding the second chip to the wafer, wherein the second pickup member and the second bonding member are spatially separated.

9. The bonding apparatus of claim 1, wherein the first and the second chip transporting devices are configured to respectively transport the first and second chips onto the wafer at the same time.

10. A bonding apparatus, comprising:
a wafer stage for holding a wafer;
a plurality of chip stages for respectively holding a plurality of chips; and
a plurality of chip transporting devices respectively movable from the chip stages to the wafer stage for respectively transporting the chips from the chip stages onto the wafer stage and configured to bond the chips to the same wafer, wherein heaviest weights that the transporting devices are designed to deal with are unequal,
wherein the chip transporting devices respectively comprise a plurality of pickup members capable of applying unequal suction forces to pick up the chips from the chip stages, and
the chip transporting devices respectively comprise a plurality of bonding members capable of applying unequal suction forces to hold the chips from the pickup members.

11. The bonding apparatus of claim 10, wherein the chip transporting devices respectively comprise a plurality of suction device for respectively applying suction forces to the chips, wherein the suction forces applied by the suction devices are unequal.

12. The bonding apparatus of claim 10, further comprising:
a plurality of chip storages; and
a chip loading device for transferring the chips from the chip storages to one of the chip stages in an alternating manner.

13. The bonding apparatus of claim 10, wherein the pickup members and the bonding members are separated robot arms capable of working individually.

14. The bonding apparatus of claim 10, further comprising:
an alignment device movable to a position between one of the chips and the wafer when a respective one of the chip transporting devices moves said one of the chips to a position above the wafer.

15. A bonding apparatus, comprising:
a wafer stage;
a first chip transporting device movable from and to the wafer stage,
wherein the first chip transporting device comprises:
a first pickup member for picking up the first chip from a first chip stage; and
a first bonding member for bonding the first chip to the wafer, wherein the first pickup member and the first bonding member are spatially separated; and
a second chip transporting device movable from and to the wafer stage, wherein the first and second transporting devices are configured to bond chips to a same wafer held by the wafer stage, wherein heaviest weights that the first and second chip transporting devices are designed to deal with are unequal.

16. The bonding apparatus of claim 15, further comprising:
an alignment device between a chip held by the first chip transporting device and a wafer held by the wafer stage when the first chip transporting device is moved to a position above the wafer stage.

17. The bonding apparatus of claim 15, further comprising:
a plurality of wafer storages; and
a wafer loading device for transferring a plurality of the wafers from the wafer storages to the wafer stage in an alternating manner.

* * * * *